(12) United States Patent
Schoumans et al.

(10) Patent No.: US 8,796,684 B2
(45) Date of Patent: Aug. 5, 2014

(54) LITHOGRAPHIC METHOD AND ARRANGEMENT

(75) Inventors: Nicole Schoumans, 's Hertogenbosch (NL); Everhardus Cornelis Mos, Best (NL); Birgitt Noëlle Cornelia Liduine Hepp, Waalre (NL); Remco Jochem Sebastiaan Groenendijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 691 days.

(21) Appl. No.: 12/786,857

(22) Filed: May 25, 2010

(65) Prior Publication Data

US 2010/0323461 A1    Dec. 23, 2010

Related U.S. Application Data

(60) Provisional application No. 61/187,845, filed on Jun. 17, 2009.

(51) Int. Cl.
*H01L 23/58* (2006.01)

(52) U.S. Cl.
USPC .......................... 257/48; 257/E21.53; 438/16

(58) Field of Classification Search
USPC ................................. 438/16; 257/E21.53, 48
See application file for complete search history.

(56) References Cited

U.S. PATENT DOCUMENTS

| | | | |
|---|---|---|---|
| 6,583,853 B1 | 6/2003 | Magome et al. | |
| 6,885,429 B2 | 4/2005 | Lyons et al. | |
| 6,952,253 B2 * | 10/2005 | Lof et al. | 355/30 |
| 7,382,447 B2 | 6/2008 | Mieher et al. | |
| 7,510,341 B2 | 3/2009 | Hayasaki et al. | |

FOREIGN PATENT DOCUMENTS

| | | |
|---|---|---|
| JP | 09-320945 A | 12/1997 |
| JP | 2000-049078 A | 2/2000 |
| JP | 2004-040102 A | 2/2004 |
| JP | 2005-026362 A | 1/2005 |
| JP | 2005-513757 A | 5/2005 |

OTHER PUBLICATIONS

English-Language Translation of Notification of Reason(s) for Refusal directed to related Japanese Patent Application No. 2010-129556, mailed Feb. 21, 2012, from the Japanese Patent Office; 3 pages.

* cited by examiner

*Primary Examiner* — Zandra Smith
*Assistant Examiner* — Toniae Thomas
(74) *Attorney, Agent, or Firm* — Sterne, Kessler, Goldstein & Fox P.L.L.C.

(57) ABSTRACT

A method is described for obtaining information for use in modeling of a lithographic process. A pattern feature is formed on a target portion of a substrate by projecting a beam of radiation onto the target portion of the substrate. For that target portion the lithographic process is characterized by one or both of a first property that varies in a first direction along a surface of the substrate, and a second property that varies in a second direction along a surface of the substrate. A property of the pattern feature is measured. Using the measured property of the pattern feature and at least one of the first and second properties, information is obtained for use in modeling the process. The lithographic process may be or include the projection of the beam of radiation onto the surface of the substrate.

20 Claims, 4 Drawing Sheets

LITHOGRAPHIC METHOD AND ARRANGEMENT

CROSS REFERENCE TO RELATED APPLICATION

This application claims the benefit of U.S. Provisional Application 61/187,845 filed on Jun. 17, 2009 under Title 35 U.S.C. §119(e).

BACKGROUND

1. Field of Invention

The invention described herein relates to a method of obtaining information for use in modeling a lithographic process, and a lithographic arrangement for carrying out that method. The lithographic arrangement may be, or may include, a lithographic apparatus as described below.

2. Related Art

A lithographic apparatus is a machine that applies a desired pattern onto a target portion of a substrate. Lithographic apparatus are used, for example, in the manufacture of integrated circuits (ICs). In that circumstance, a patterning device, such as, for examples, a mask or a reticle, may be used to generate a circuit pattern corresponding to an individual layer of the IC. This pattern can be imaged onto a target portion (e.g. comprising part of, one or several dies) on a substrate (e.g. a silicon wafer) having a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning-direction") while synchronously scanning the substrate parallel or anti parallel to this direction.

When providing pattern features on a substrate, it is usual to make use of a model of a lithographic process (often referred to as a lithographic process model). A model of a lithographic process allows the processing of a substrate to be taken into account, so that when patterns are applied to the substrate they may be applied in a desired (e.g. uniform) manner. The processing of a substrate may include, for example, providing an amount of material on the substrate (e.g. providing a layer of material on the substrate), or removing an amount of material from the substrate (for example, by the use of a developer or an etching process or the like), or the lithographic application of patterns to the substrate. It is usual for a model of a lithographic process to have built into it details of relationships between different processes that may be applied to the substrate and the affect of these processes on one another. For instance, for a pattern feature having a certain critical dimension or sidewall angle to be applied to a target portion of a substrate, a model of a lithographic process may be used to provide at least an indication of, or calculate, the required dose of radiation of a beam of radiation used to provide that pattern feature, or a focal property of that beam. In order to achieve this, the model of the lithographic process may need to have built into it relationships relating to how the provision of material on the substrate, or the removal of material from the substrate may affect the critical dimension or sidewall angle of the pattern feature for a beam of radiation providing a given dose of radiation and having a specific focal property.

In order to create and establish a model of a lithographic process, measurements may be taken. Relationships may then be determined based on the results of those measurements. Those relationships may then form the basis of the model, and allow the prediction or calculation of, for example, changes in the critical dimension and/or sidewall angle of a pattern feature as a function of process conditions. For instance, the thickness of resist deposited on a substrate may be measured. The critical dimension or sidewall angle of pattern features provided using that resist may be subsequently measured. A relationship between the critical dimension, sidewall angle and resist thickness can then be established and form the basis of at least a part of a model of a lithographic process. In future, this relationship can be used, for example, to control the dose of radiation provided by a beam of radiation in order to ensure that the critical dimension and sidewall angle of pattern features is more uniform across the substrate than if the variation in resist thickness had not been taken into account.

Resist (or any other material) that is provided on a substrate is not often provided with a uniform thickness, despite best efforts to avoid thickness variation. For instance, the deposition of resist or the like may have a radial thickness profile, for example, the resist has increased thickness from the centre of the substrate to the outside of the substrate, or decreased thickness from the centre of the substrate to the outside of the substrate. Such variation may be a result of spin-coating of the resist onto the substrate. Alternatively or additionally, a degree of removal of material from the substrate may also vary across the substrate. For instance, the etching of material from a substrate may result in more material being removed from one area of a substrate than from another area of the substrate. In summary, the processing of a substrate will have an associated fingerprint. This fingerprint may be, for example, a function of thickness of material provided on the substrate, or be a function of the amount of material removed from the substrate (e.g. a thickness variation profile, or an etch rate profile), or a combination of these functions. It is known to determine information regarding such a fingerprint and to form a model of a lithographic process that takes into account the fingerprint. Using such a model may thus ensure that pattern features may be applied to a substrate more uniformly.

Various different methods have been proposed for obtaining information for modeling a lithographic process, so that for example the fingerprint referred to above can be taken into account. Some of these methods include taking measurements of pattern features from only a small area of a substrate, which does not allow information across an entire or a majority surface of the substrate to be obtained. Other methods include using small target portions on a substrate, and varying exposure conditions between each target portion. However, while this method may allow some information to be determined across the entire or a majority surface of the substrate, it would be desirable to obtain even more information.

What is needed is to provide, for example, a method of obtaining information for use in modeling a lithographic process, and a lithographic arrangement for carrying out that method, which obviates or mitigates one or more problems of the prior art, whether identified herein or elsewhere, or which provides an alternative to an existing method or apparatus.

BRIEF SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

According to an embodiment of the invention, there is provided a method of obtaining information for modeling a lithographic process. A pattern feature is formed on a target portion of a substrate by projecting a beam of radiation onto the target portion of the substrate, for that target portion the lithographic process is characterized by one or both of a first property that varies in a first direction along a surface of the substrate, and a second property that varies in a second direction along a surface of the substrate. A property of that pattern feature is measured. Using the measured property of the pattern feature and at least one of the first property of the lithographic process and the second property of the lithographic process information is obtained for use in the process model. The lithographic process may be or include the projection of the beam of radiation onto the surface of the substrate.

The first direction may be substantially perpendicular to the second direction. If the pattern feature is formed by scanning of the beam of radiation across the substrate, the first direction or second direction may be substantially parallel to a scan direction of the scanning. The first property and second property may each be a different one of: a focal property, a dose of radiation, an overlay, an illumination property.

According to an embodiment of the invention, the method may include forming pattern features on different target portions of a substrate by projecting a beam of radiation onto the different target portions of the substrate. The lithographic process may have a third property, the third property being different for different target portions. The lithographic process may be or include the projection of the beam of radiation onto the surface of the substrate.

According to embodiments of the invention, the method may include forming pattern features on different target portions of a substrate by projecting a beam of radiation onto the different target portions of the substrate. The method may include forming pattern features on different target portions of a substrate by projecting a beam of radiation onto the different target portions of the substrate, the variation in the first and/or second property being different for different target portions. The method may include forming pattern features on different target portions of a substrate by projecting a beam of radiation onto the different target portions of the substrate. The different target portions of the substrate may together cover a majority of a surface of the substrate.

The variation in one of or both of the first property and the second property may be such that the property increases or decreases from a first value to a second value. The variation in one of or both of the first property and the second property may be such that the property is varied: to include a value of interest; and/or to increase or decrease from a value of interest; and/or to increase or decrease to a value of interest; and/or to vary around a value of interest, which may include the value of interest.

The property of the pattern feature that is measured is a property that is dependent on processing of the substrate. According to an embodiment, the processing of the substrate may be related to at least one of: providing an amount of material on the substrate; and/or removing an amount of material from the substrate, and/or the projection of the beam of radiation onto the substrate; and/or a temperature during which an amount of material is provided on the substrate, and/or a temperature at which an amount of material is removed from the substrate, and/or a temperature at which the beam of radiation is projected onto the substrate.

According to an embodiment, the property of the pattern feature that is measured may be at least one of: a critical dimension of the pattern feature (e.g. a line width, a gap width, a line end, a line length); and/or a dimension of the pattern feature; and/or a sidewall angle of the pattern feature.

According to an embodiment, using the measured property of the pattern feature and at least one of the first property of the lithographic process and the second property of the lithographic process to obtain information for use in the process model may include: establishing a relationship (or more than one relationship) between the variation in the first property of the lithographic process and/or the second property of the lithographic process, and the measured property of the pattern feature. At least a part of the lithographic process model may be based on the relationship. One or more of such relationships may be, may describe, may include or may relate to a fingerprint associated with the processing of the substrate.

According to another embodiment of the invention, there is provided a lithographic arrangement for implementing a lithographic process. The lithographic arrangement includes an illumination system for providing a beam of radiation. A support structure supports a patterning device which is arranged to impart the beam of radiation with a pattern in its cross-section. A substrate table is arranged to hold a substrate. A projection system is arranged to project the patterned beam of radiation onto a target portion of the substrate. One or more controllers are configured to control at least a part of the lithographic arrangement to, in use: form a pattern feature on a target portion of a substrate by projecting a beam of radiation onto the target portion of the substrate. For that target portion the one or more controllers are configured to ensure that the lithographic process has one or both of a first property that varies in a first direction along a surface of the substrate, and a second property that varies in a second direction along a surface of the substrate. The lithographic arrangement further includes a measurement arrangement for measuring a property of the pattern feature. A computational arrangement is configured to use the measured property of the pattern feature and at least one of the first property of the lithographic process and the second property of the lithographic process to obtain information for use in a lithographic process model.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
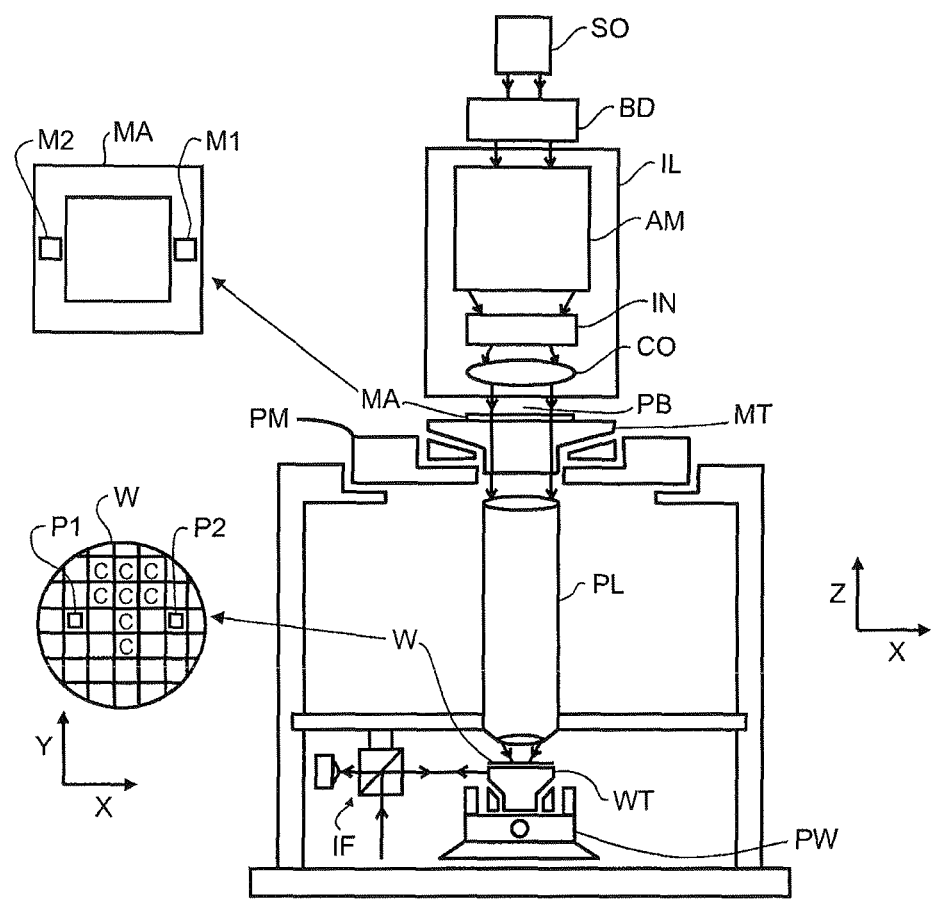
FIG. 1 schematically depicts a lithographic apparatus according to an embodiment of the invention.

The invention will be better understood from the following descriptions of various "embodiments" of the invention. The "embodiments" are views of the invention, but each is not the whole invention. Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm, or lower) and extreme ultra-violet (EUV) radiation (e.g. having a wavelength in the range of 5-20 nm).

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming beam of radiation in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to an embodiment of the invention. The apparatus includes:
  an illumination system (illuminator) IL to condition a beam PB of radiation (e.g. UV radiation or EUV radiation).
  a support structure (e.g. a support structure) MT to support a patterning device (e.g. a mask) MA and connected to first positioning device PM to accurately position the patterning device with respect to a projection system PL;
  a substrate table (e.g. a wafer table) WT for holding a substrate (e.g. a resist coated wafer) W and connected to second positioning device PW for accurately positioning the substrate with respect to item PL; and
  a projection system (e.g. a refractive projection lens) PL configured to image a pattern imparted to the beam of radiation PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the beam of radiation is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB, having a desired uniformity and intensity distribution in its cross section.

The beam of radiation PB is incident on the patterning device (e.g. mask) MA, which is held on the support structure MT. Having traversed the patterning device MA, the beam PB passes through projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic model of the lithographic process exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

When providing pattern features on a substrate using lithography, it is common to make use of a model of a lithographic process (sometimes referred to as a process model), as described above. A model of a lithographic process is based on relationships between processing of the substrate, for example providing material on that substrate, or removing material from that substrate, and the provision of pattern features on that substrate, and the inter-relationship between these. Using a model of a lithographic process, it is possible to, for example, be able to determine what exposure conditions are required for different parts of a substrate in order to ensure that, for example, the critical dimension (e.g. a line width, a gap width, a line end, a line length) or sidewall angle of pattern features is as desired (for example, and/or is uniform across the substrate).

Figure 2:
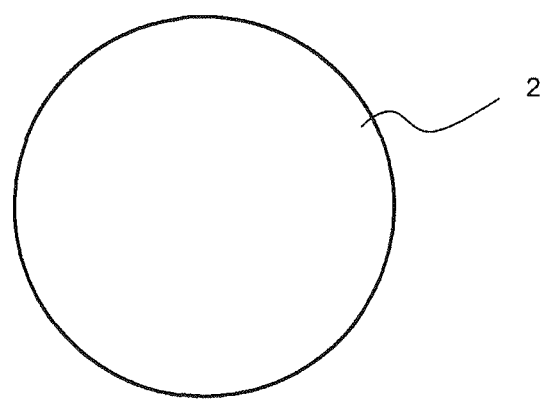
FIG. 2 schematically depicts a plan view of a substrate.

FIG. 2 schematically depicts a substrate 2 (for example, the substrate described above in relation to FIG. 1). The substrate 2 is provided with a layer of resist on to which a beam of radiation may be projected, as described above in relation to FIG. 1. It might be assumed that the layer of resist has a uniform thickness across the substrate. However, in practice, this is not the case. In practice there are small but significant variations in the thickness of the resist across the substrate 2.

Figure 3:
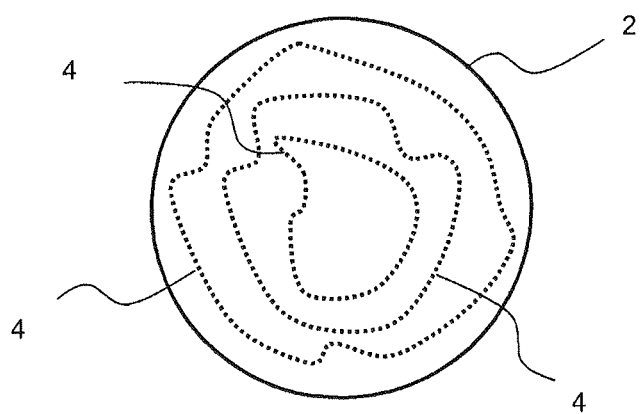
FIG. 3 schematically depicts a plan view of a substrate and also a fingerprint associated with the processing of that substrate.

FIG. 3 schematically depicts the same substrate 2. Dotted lines depict contours 4 which are representative of regions of resist which have the same thickness. In the example shown in FIG. 3, the thickness of resist is shown as having a radial-like distribution. For instance, the resist may increase in thickness away from the centre of the substrate 2, or decrease in thickness away from the centre of the substrate 2. This increase or decrease may be caused by the manner in which the resist was provided on the substrate 2, for example, by spin-coating or the like. Thus, the processing of the substrate to provide material (in this example, resist) on the substrate 2 has an associated fingerprint in the form of the contours 4. In order to ensure that pattern features are accurately applied to the substrate 2 in a subsequent exposure of the substrate 2, it is desirable to ensure that a model of a lithographic process is used to determine the required exposure conditions takes into account the fingerprint depicted by contours 4. This is to reduce or eliminate any non-uniformity in, for example, the critical dimension (e.g. a line width, a gap width, a line end, a line length) or sidewall angles of pattern features formed on different areas (e.g. target portions) of the substrate where there exists a variation in resist thickness. The same processing conditions used in the processing of subsequent substrates may also have the same or similar associated processing fingerprint. Thus the model of the lithographic process can be used when providing pattern features on subsequently processed substrates.

While FIG. 3 was described in relation to the processing of a substrate having an associated fingerprint relating to thickness of resist deposited on the substrate, fingerprints associated with other processing of the substrate may provide alternative or additional fingerprints that need to be taken into account in a model of a lithographic process. For instance, any process involving the removal of material from the substrate (for example, involving development or etching of material from the substrate) may also have an associated fingerprint that needs to be taken into account by a model of a lithographic process. For example, the removal of material from the substrate using an etching process may not be uniform across a substrate, but may result in more material being removed from the centre of the substrate than from the periphery of the substrate, or the like.

In order to create or establish a model of a lithographic process, it is desirable to be able to determine how properties of pattern features applied to a substrate vary across a substrate. For instance, if the same pattern features are applied across a substrate, but subsequent measurement shows the critical dimension or sidewall of angle of those pattern features varies across a substrate, a fingerprint associated with the processing of the substrate may be discernable and taken into account in subsequent exposures. A model of a lithographic process may be created to take this fingerprint into account in subsequent exposures.

In order to establish a model of a lithographic process by taking measurements of pattern features applied to a substrate, it is desirable to obtain as much information as possible, and as quickly as possible, while minimizing the number of substrates required to provide these measurements. According to one embodiment of the present invention, there is provided a method of obtaining information for use in a model of a lithographic process. The method includes forming a pattern feature on a target portion of a substrate by projecting a beam of radiation on to the target portion of the substrate. For that target portion, the lithographic process (e.g. the beam of radiation projected onto the target portion) has a first property that varies in a first direction along a surface of the substrate, and/or a second property that varies in a second direction along a surface of the substrate. The method further includes measuring a property of that pattern feature. Furthermore, the method further includes using the measured property of the pattern feature and at least one of the first property of the lithographic process and the second property of the lithographic process to obtain information for use in the model. An advantage of the embodiment of the present invention is that, for the target portion of the substrate, the lithographic process (e.g. the beam of radiation projected onto that target portion) has a first property that is varied in a first direction along a surface of the substrate, and/or a second property that is varied in a second direction along a surface of the substrate. By varying a first and/or second property of the lithographic process when projecting the beam of radiation on to a single target portion of a substrate, more information for use in a model of a lithographic process can be determined than if the first and/or second properties remain constant for that target portion. This is because any variation in a measured property of a pattern feature can be related to the variation in one or both of the first and second properties of the lithographic process (e.g. the beam of radiation projected onto the target portion). Because more information can be obtained, the obtaining of the information is quicker than existing methods, more accurate information for use in the model of the lithographic process can be determined, and/or fewer substrates are required in order to obtain the required information for use in the model.

An embodiment of the present invention will now be described, by way of example only, with reference to FIGS. 4 to 9.

Figure 4:
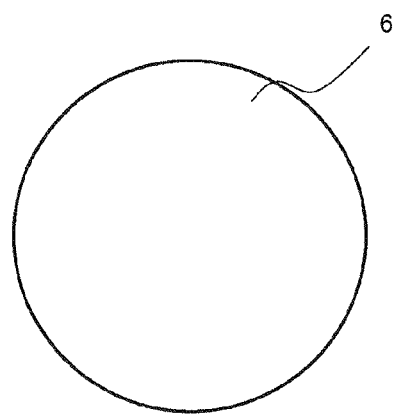
FIG. 4 schematically depicts a plan view of a substrate.

FIG. 4 schematically depicts a plan view of a substrate 6 (for example the substrate described above in relation to FIG. 1, and/or in relation to FIGS. 2 and 3). The substrate 6 is provided with a layer of resist. The layer of resist may be exposed to a beam of radiation in order to provide pattern features using that layer of resist. Due to processing conditions, the layer of resist may have a processing fingerprint associated with it, for example as represented by the contours shown in and described with reference to FIG. 3. In order to be able to obtain information for use in a model of a lithographic process, pattern features are provided using the layer of resist. Properties of those pattern features are measured so that information can be obtained which can be used to determine and take into account such a processing fingerprint.

Figure 5:
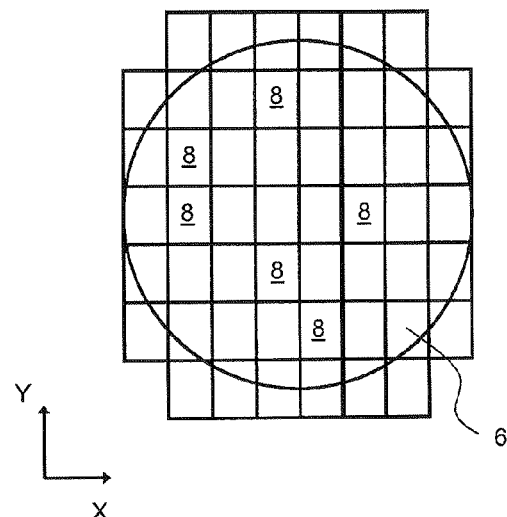
FIG. 5 schematically depicts a plan view of a substrate together with the shape and location of target portions of that substrate on to which pattern features are to be applied.

FIG. 5 schematically depicts the substrate 6 in plan view. A lithographic apparatus (for example, the apparatus shown in and described with reference to FIG. 1) is used to apply pattern features to the substrate 6. Pattern features are formed in various target portions 8 of the substrate 6 by projecting a beam of radiation on to each target portion of the substrate 6.

An exposure field used to form a pattern feature on a target portion of the substrate may extend beyond a periphery of the substrate, as can be seen in FIG. 5. The target portion of the substrate may alternatively or additionally be described as that portion of a predetermined exposure field that is incident on the surface of the substrate.

Figure 6:
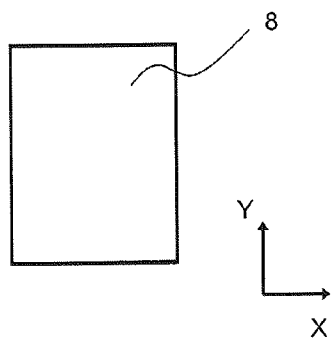
FIG. 6 schematically depicts a target portion of a substrate.

FIG. 6 shows that a typical target portion 8 of a substrate is rectangular in shape, as is known in the art. In existing methods for obtaining information for use in a model of a lithographic process, it is known to vary properties for the projection of a beam of radiation on to different target portions of the substrate. In stark contrast, and in accordance with an embodiment of the present invention, properties of the lithographic process (e.g. the beam of radiation projected onto the target portion) are varied within a target portion.

Figure 7:
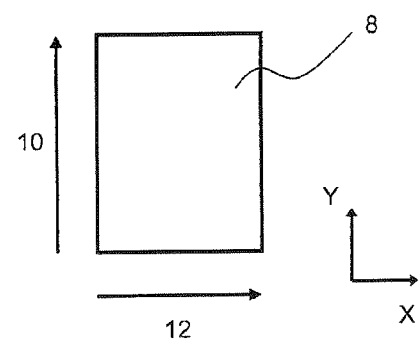
FIG. 7 schematically depicts a target portion of a substrate, and a variation of a first property of a lithographic process in a first direction of that target portion, and a variation of a second property of that lithographic process in a second direction for that target portion, in accordance with an embodiment of the present invention.

FIG. 7 schematically depicts a principle associated with an embodiment of the present invention. FIG. 7 shows that instead of varying properties of the beam of radiation between target portions of a substrate, properties of the beam of radiation are varied within (i.e. for) a given target portion of the substrate. Specifically, FIG. 7 shows that for the target portion 8, the beam of radiation has a first property 10 which varies in a first direction along a surface of the substrate (indicated by an arrow) and a second property 12 which varies in a second direction, different, direction along a surface of the substrate (indicated by an arrow). The first direction is substantially perpendicular to the second direction in this embodiment. If the target portion 8 of the substrate is exposed to radiation (i.e. if a pattern feature is formed) by scanning of the beam of radiation across the substrate, the first direction or second direction may be substantially parallel to a scan direction of the scanning. For instance, referring to FIG. 7, if the beam of radiation is scanned in the Y-direction, it can be seen that the first property 10 of the beam of radiation is varied in a direction parallel to the Y-direction.

The first property that is varied and the second property that is varied may be different from one another so that as much variation in exposure conditions within a target portion of a substrate may be achieved. The first property and second property may each be a property of the lithographic process, which may include a property of the projection of the beam of radiation. The first property and second property may each be a different one of: a dose of radiation provided by the beam of radiation; a focal property (e.g. a focal length of a lithographic arrangement used to expose the target portion, or a depth of focus of a lithographic arrangement used to expose the target portion); an overlay, or an illumination property (e.g. a wavelength of radiation, a polarization state, numerical aperture, a diameter of the radiation beam, an angular intensity distribution, an illumination mode).

The first and second properties may be varied (i.e. controlled) in any appropriate manner. For example, the dose, focal property, overlay and illumination property may be varied in any suitable manner. The dose may be varied by passing the beam of radiation through an object with varying transmittance, or by reflecting the beam of radiation off an object with varying reflectance. The focal property may be varied by tilting of the substrate, or by the movement or orientation of one of more optical elements in the apparatus that provides the beam of radiation. The overlay can be varied by moving the patterning device (e.g. a mask) in relation to the substrate (or the substrate in relation to the patterning device), or by changing a way in which the beam of radiation is projected onto the substrate (e.g. by controlling a magnification factor). The illumination property may be varied by varying an illumination mode, which may be varied by, for example, changing the illumination mode as the target portion is exposed to radiation in a given direction. This may be achieved by, for example, by changing the illumination mode in-between pulses of a pulsed radiation source or the like.

The method may include forming pattern features on different target portions of a substrate by projecting a beam of radiation onto the different target portions of a substrate. Different target portions may together cover a majority of the surface of the substrate, or substantially the entire surface of the substrate. This allows processing information to be obtained for the majority of the surface of a substrate, or the entire surface of the substrate.

The variation in one of or both of the first property and the second property of the lithographic process may be such that the property increases or decreases from a first value to a second value. For instance, the dose of radiation provided by the beam of radiation may increase or decrease across the target portion. Alternatively or additionally, a focal point of the beam of radiation may be moved towards or away from the target portion of the substrate in a direction across the target portion. The variation in the first and second properties of the lithographic process may not be arbitrary, but may be chosen to vary about a particular value, for example a value of interest. A value of interest may be a value which requires further investigation, or a value which is likely to be of use in future exposures, or a value which has caused problems in the past, or the like. For one or both of a first property and a second property, the respective property may be varied to include a value of interest, and/or to increase or decrease from a value of interest, and/or to vary around a value of interest, which may include the value of interest itself. In one example, it may desirable to obtain information regarding how a change in dose or focal property affects the critical dimension or sidewall angle of pattern features provided using the beam of radiation. Information may be required around or about a specific dose of radiation or focal position of the beam of radiation. Therefore, and in one example, in a first direction of the target portion a dose of radiation may increase from a first value to a second value, the dose value of interest being located between these first and second values. In a second direction, the focal point of the beam of radiation may vary from a first value to a second value, a focal point of interest being located between the first and second values.

The variation of the first and/or second properties of the lithographic process for a given target portion may be different for different target portions. Such a difference may be required when it is desired to obtain information about different values of the first and/or second property of the lithographic process for different parts of the substrate.

When one or more pattern features have been formed on one or more target portions of the substrate by projecting a beam of radiation on to the one or more target portions, a property of that or those pattern features is measured. The property may be, for example, a critical dimension of the pattern feature (e.g. a line width, a gap width, a line end, a line length), a sidewall angle of the pattern feature, a line width of the pattern feature, or the like. In general, the property of the pattern feature that is measured is a property that is dependent upon processing of the substrate. For instance, the processing may be related to at least one of providing an amount of material on a substrate (e.g. depositing a layer of resist or the like on the substrate), and/or removing an amount of material from a substrate (for example, developing resist, or etching material from the substrate), or the projection of a beam of radiation onto the substrate.

Once the property of the pattern feature has been measured, the measured property of the pattern feature and at least one of the first property of the lithographic process and the second property of the lithographic process are used to obtain information for constructing the model of the lithographic process. This may include establishing a relationship between the variation in the first property of the lithographic process and/or the second property of the lithographic process, and the measured property of the pattern feature. Thus, in one embodiment, the method may include, for one or more target portions of a substrate, determining a relationship between a variation in radiation dose and focal property with an associated variation in a measured property of the pattern feature (e.g. a line width, a sidewall angle, a critical dimension, or any other dimension of the pattern feature). A relationship (or one or more such relationships) may form at least a part of the model of the lithographic process. The implementation of subsequent exposures can use such a model to be able to determine what the required dose and focal property (or any other property of the beam of radiation or lithographic process in general) needs to be in order to achieve a specific or desired value or range of values of a property of the pattern feature (for example, a dimension of the pattern feature, such as a critical dimension, line width or side wall angle).

In accordance with an embodiment of the present invention, the variation in the first and second properties of the lithographic process when forming one or more pattern features on a target portion of a substrate allows more information to be obtained for use in a model of the lithographic process. For instance, for a single target portion, any measured property of the one or more pattern features can be related to variations in one or two properties (i.e. the first and/or second properties) of the lithographic process. In contrast, if this information were to be obtained by only varying properties of the beam of radiation between target portions (as in existing methods), a greater number of target portions would be required, taking more time to implement and/or more substrate space and/or more substrates. With reference to existing methods, by varying a single property of the beam of radiation between target portions, information regarding another property of the beam of radiation (or of the lithographic process in general) cannot be obtained for that target portion, reducing the potential information that could be obtained for that target portion. Embodiments of the present invention do not have this disadvantage.

A single pattern feature may be applied to a target portion of a substrate. It may be more useful, however, to apply a plurality of pattern features to any given target portion of the substrate, the intention being that those pattern features are the same or substantially the same as each other. These pattern features thus provide a constant, relative to which any variation can be measured. For example, this allows the measurements of properties of those different pattern features to be compared, and allows any dependence on the measured properties to be more easily and accurately determined as a function of one or both of the first and second properties of the lithographic process.

Figure 8:
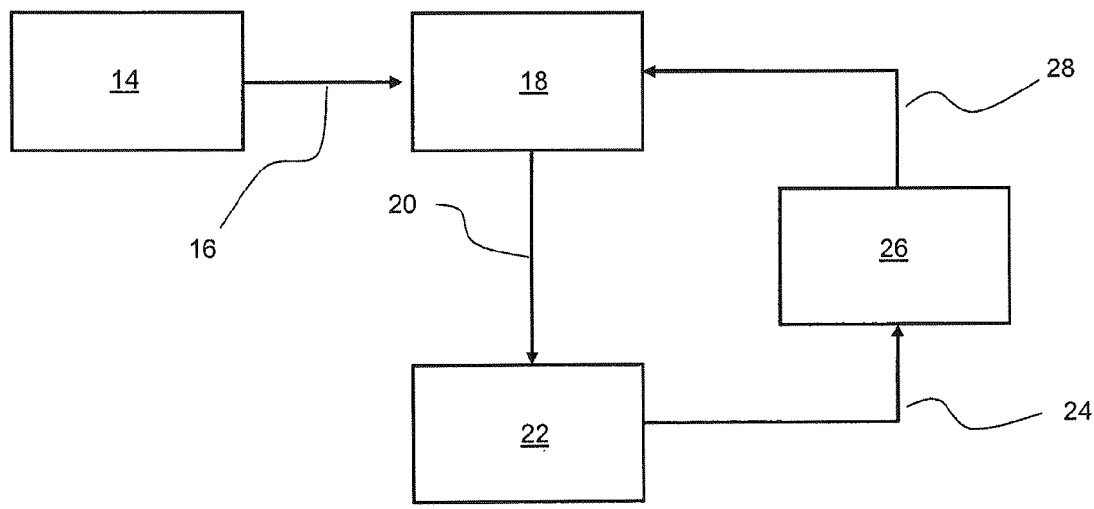
FIG. 8 schematically depicts a flow chart summarizing a method according to an embodiment of the present invention.

FIG. 8 is a flow chart schematically depicting a representation of the method described above. In a first step 14, a substrate is provided with a layer of material, for example photo resist. The substrate is then loaded (depicted by arrow 16) into a lithographic apparatus 18.

The lithographic apparatus is used to form one or more pattern features on one or more target portions of the substrate by projecting a beam of radiation on to the target portion of the substrate. For one or more of those target portions, the lithographic process (e.g. the projection of the beam of radiation onto the substrate) has a first property that varies in a first direction along a surface of the substrate, and a second property that varies in a second direction along a surface of the substrate. One or more controllers of the lithographic apparatus may be configured to control one or more parts of a lithographic apparatus to ensure that the property of the lithographic process is implemented in this manner.

The substrate is then passed (depicted by arrow 20) to a measurement arrangement 22 (for example, often referred to as metrology stage). The measurement arrangement 22 measures one or more properties of the pattern feature, as described above. The property may be, for example, a critical dimension of a pattern feature or the sidewall angle of the pattern feature, or any other suitable dimension of the pattern feature that may be dependent on processing of the substrate. Information at least related to the measured property is then passed (depicted by arrow 24) to a computation arrangement 26. Information at least related to the measured property could be the measured property itself, or information indicative of, proportional to or in some other way associated with or related to the measured property.

The computation arrangement 26 is an arrangement configured to use the one or more measured properties of the pattern feature and at least on of the first property of the lithographic process (e.g. the beam of radiation) and the second property of the lithographic process (e.g. the beam of radiation) to obtain information for use in a model of a lithographic process. For example, the computational arrangement 26 may be configured to establish one or more relationships between the measured property of the pattern features and varied properties of the beam of radiation, as discussed above. A processing fingerprint may be determined from such measurements, and this fingerprint may be taken into account in future exposures using the relationships established using these measurements. The computational arrangement may then provide information (depicted by arrow 28) to the lithographic apparatus 18 so that, for example, in future exposures the lithographic apparatus can be controlled to ensure that pattern features are more uniformly applied to a substrate using a model of a lithographic process provided with information obtained using the above-described method, or a model of a lithographic process provided with relationships established using the measured information.

Figure 9:
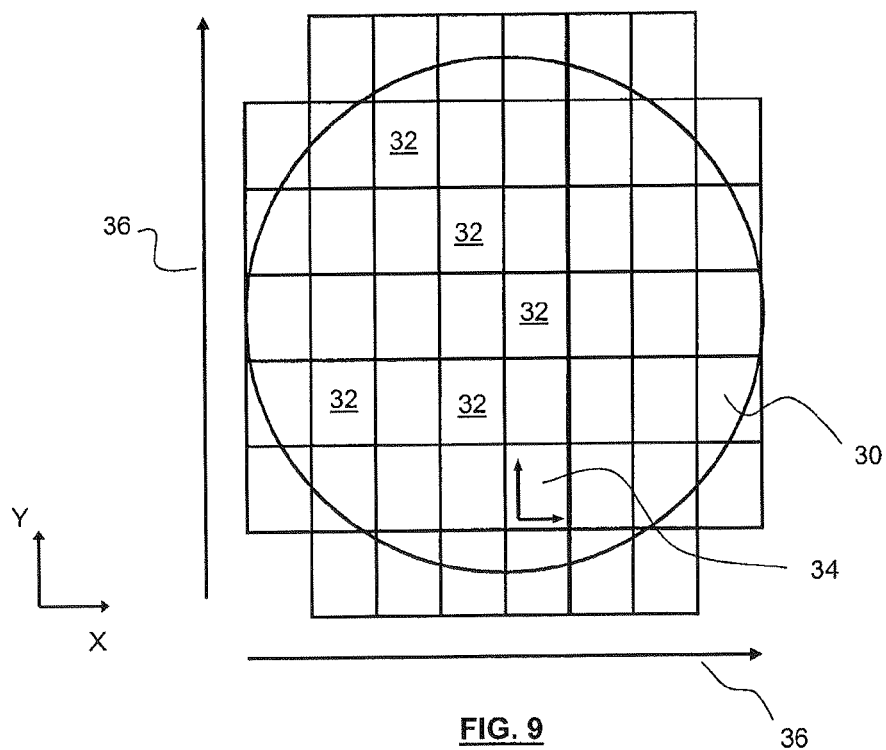
FIG. 9 schematically depicts a plan view of a substrate, together with the shape and location of target portions of that substrate, and also a variation of properties of the lithographic process within target portions of that substrate, and variation of a property of the lithographic process between target portions of that substrate.

FIG. 9 schematically depicts a substrate 30 and various target portions 32 in a similar manner to that discussed above in relation to FIG. 5. Within a given target portion 32, a first property of a lithographic process (e.g. the projection of the beam of radiation) may be varied in a first direction along a surface of the substrate, and a second property of the lithographic process (e.g. the projection of the beam of radiation) may be varied in a second direction along a surface of the substrate. This is depicted by arrows 34 which are shown as being located within a target portion 32. In addition, in order to obtain even more information for use in the model of the lithographic process, the method may include forming pattern features on different target portions of a substrate by projecting a beam of radiation onto the different target portions of a substrate, and wherein the lithographic process (e.g. the projection of the beam of radiation) has a third property, the third property being different (or in other words, varied) for those different target portions. This is schematically depicted in the Figure by arrows 36, which depict variation of a third property of the beam of radiation between target portions 32. The third property of the lithographic process may be, for example, a focal property, a dose, an overlay, or an illumination property as discussed above in relation to the first and second properties of the lithographic process (e.g. the projection of the beam of radiation). A fourth property may also be varied. For example, a third property may be varied for different target portions extending in a first direction, and a fourth property may be varied for different target portions extending in a second, different, direction.

The third property of the lithographic process (e.g. the projection of the beam of radiation) may be varied (i.e. controlled) in any appropriate manner. For example, the dose, focal property, overlay or illumination property may be varied in any suitable manner. The dose may be varied by passing the beam of radiation through an object with varying transmittance, or by reflecting the beam of radiation off an object with varying reflectance. The focal property may be varied by tilting of the substrate, or by the movement or orientation of one of more optical elements in the apparatus that provides the beam of radiation. The overlay can be varied by moving the patterning device (e.g. a mask) in relation to the substrate (or the substrate in relation to the patterning device), or by changing a way in which the beam of radiation is projected onto the substrate (e.g. by controlling a magnification factor). The illumination property may be varied by varying an illumination mode, which may be varied by changing the shape, position or configuration of one or more optical elements (e.g. transmissive elements, refractive elements, diffractive elements, reflective elements) between the exposures of different target portions.

In a similar manner to that discussed above in relation to the variation of the first and or second properties of the lithographic process (e.g. the projection of the beam of radiation), the variation in the third property of the lithographic process (e.g. the projection of the beam of radiation) may be such that the property increases or decreases from a first value to a second value. Alternatively or additionally, the variation may be varied to include a value of interest, and/or to increase or decrease to a value of interest, and/or to increase or decrease from a property of interest and/or to vary around the property of interest, which variation may include the property of interest itself.

In one example, the first property, second property and third property are all different from one another so that as much variation in the exposure conditions as possible may be achieved, allowing more relationships to be established, and therefore a model of a lithographic process to be established more accurately and/or more rapidly. In another embodiment, the third property could be the same as the first or second property.

An arrangement may be provided for carrying out at least a part of the method described above. A lithographic arrangement may be provided, comprising: an illumination system for providing a beam of radiation; a support structure for supporting a patterning device (e.g. a mask or mirror array), the patterning device serving to impart the beam of radiation with a pattern in its cross-section; a substrate table for holding a substrate; a projection system for projecting the patterned beam of radiation onto a target portion of the substrate; and one or more controllers. The one or more controllers may be configured to control at least a part of the lithographic arrangement to, in use, form a pattern feature (or one or more pattern features) on a target portion (or one or more target portions) of a substrate by projecting a beam of radiation onto the target portion of the substrate. For that target portion, the one or more controllers may be configured to ensure that the lithographic process (e.g. the projection of the beam of radiation) has a first property that varies in a first direction along a surface of the substrate, and a second property that varies in a second direction along a surface of the substrate.

The one or more controllers may vary (i.e.) control the first or second properties of the lithographic process (e.g. the projection of the beam of radiation) by controlling one or more parts of the lithographic arrangement (e.g. a configuration, position, shape, orientation, transmittance or reflectance of one or more parts of the lithographic arrangement).

The lithographic arrangement may also include a measurement arrangement for measuring a property of the pattern feature. The lithographic arrangement may also include a computational arrangement configured to use the measured property of the pattern feature and at least one of the first property of the lithographic process and the second property of the lithographic process to obtain information for use in a model of a lithographic process.

The measurement arrangement may be any arrangement that is capable of measuring a property of the pattern feature, for example a dimension of that pattern feature (e.g. a line width, a critical dimension, a sidewall angle). For example, the measurement arrangement may include one or more microscopes or radiation beam reflection, refraction or scattering arrangements, as known in the art. The computational arrangement may be any arrangement that is configured to use the measured property of the pattern feature and at least one of the first property of the lithographic process and the second property of the lithographic process to obtain information for use in a model of a lithographic process. The computational arrangement may be a computer or an arrangement other than a computer, for example an embedded processor, or other hardware having instructions, lines of code or other software configured to use the measured property of the pattern feature and at least one of the first property of the lithographic process and the second property of the lithographic process to obtain information for use in a model of a lithographic process.

The lithographic arrangement may be a lithographic apparatus (for example, as described above in relation to FIG. 1), and one or more controllers for controlling one or more parts of that apparatus, and a measurement arrangement, and a computational arrangement.

In the embodiments described thus far, the variation of a first property of a lithographic process and a second property of a lithographic process has been described. In another embodiment, only one property may be varied. The variation of only a single property may not provide as much information as would be the case with the variation of two properties. However, the variation of a single property may be easier to implement, or may allow information related to the variation from measurement of one or more properties of pattern features to be extracted more rapidly or with less difficulty.

In the description of embodiments of the invention, the term 'target portion' has been used. This term is often used interchangeably with the term 'field' to include the pattern on a substrate where a pattern will be applied. The terms 'target portion' and 'field' may thus be used interchangeably in the description of embodiments of this invention.

In the description of embodiments of the invention, the model of the lithographic process has been described as being used to take into account, for example processing of the substrate that might include the addition of material to a substrate, and/or the removal of material from the substrate. Other process factors may also have an influence on the uniformity of one or more properties of pattern features applied to a substrate. For example, temperature may have an affect on one or more properties of a pattern feature, for example if there is any temperature dependence on any stage of the photolithographic process used to form that pattern feature (e.g. during which an amount of material is provided on the substrate, an amount of material is removed from the substrate, the beam of radiation is projected onto the substrate). There may alternatively or additionally be an error associated with the lithographic apparatus itself, which results in one or more properties of pattern features that are applied to the substrate not being as intended. For example, even though a mask pattern may have a patter feature with a certain shape, aberrations in the projection system may result in a distortion of the shape of a pattern feature that is applied to a substrate using that mask pattern. The projection of the beam of radiation onto the substrate may itself have an error with a fingerprint as discussed above. All of these process factors may be taken into account by a model of a lithographic process.

While specific embodiments of the invention have been described above, it will be appreciated that the invention may be practiced otherwise than as described. The description is not intended to limit the invention.

What is claimed is:

1. A method of obtaining information for use in modeling a lithographic process, the method comprising:
    forming a pattern feature on a target portion of a substrate by projecting a beam of radiation onto the target portion of the substrate, for that target portion the lithographic process having one or both of a first property that varies in a first direction along a surface of the substrate, and a second property that varies in a second direction along a surface of the substrate;
    measuring a property of that pattern feature; and
    using the measured property of the pattern feature and at least one of the first property of the lithographic process and the second property of the lithographic process to obtain information for use in the model.

2. The method of claim 1, wherein the first direction is substantially perpendicular to the second direction.

3. The method of claim 2, wherein, if the pattern feature is formed by scanning of the beam of radiation across the substrate, the first direction or second direction is substantially parallel to a scan direction of the scanning.

4. The method of claim 1, wherein, if the pattern feature is formed by scanning of the beam of radiation across the substrate, the first direction or second direction is substantially parallel to a scan direction of the scanning.

5. The method according to claim 1, wherein the first property and second property are each a different one of: a focal property, a dose of radiation, an overlay, an illumination property.

6. The method according to claim 1, wherein the method comprises forming pattern features on different target portions of the substrate by projecting a beam of radiation onto the different target portions of the substrate, the lithographic process having a third property, the third property being different for different target portions.

7. The method according to claim 1, wherein the method comprises forming pattern features on different target portions of the substrate by projecting a beam of radiation onto the different target portions of the substrate, the variation in the first and/or second property being different for different target portions.

8. The method according to claim 1, wherein the method comprises forming pattern features on different target portions of the substrate by projecting a beam of radiation onto the different target portions of the substrate, and wherein the different target portions of the substrate together cover a majority of a surface of the substrate.

9. The method according to claim 1, wherein the variation in one of or both of the first property and the second property is such that the property increases or decreases from a first value to a second value.

10. The method according to claim 1, wherein the variation in one of or both of the first property and the second property is such that the property is varied:
   to include a value of interest; and/or
   to increase or decrease from a value of interest; and/or
   to increase or decrease to a value of interest; and/or
   to vary around a value of interest, which may include the value of interest.

11. The method according to claim 1, wherein the property of the pattern feature that is measured is a property that is dependent on processing of the substrate.

12. The method of claim 11, wherein the processing of the substrate includes at least one of:
   providing an amount of material on the substrate; and/or
   removing an amount of material from the substrate; and/or
   projecting of the beam of radiation onto the substrate; and/or
   controlling a temperature at which an amount of material is provided on the substrate, and/or a temperature at which an amount of material is removed from the substrate, and/or a temperature at which the beam of radiation is projected onto the substrate.

13. The method according to claim 1, wherein the property of the pattern feature that is measured is at least one of:
   a critical dimension of the pattern feature; and/or
   a dimension of the pattern feature; and/or
   a sidewall angle of the pattern feature.

14. The method according to claim 1, wherein using the measured property of the pattern feature and at least one of the first property of the lithographic process and the second property of the lithographic process to obtain information for use in the model comprises:
   establishing a relationship between the variation in the first property of the lithographic process and/or the second property of the lithographic process, and the measured property of the pattern feature.

15. The method of claim 14, wherein at least a part of the model is based on the relationship.

16. A lithographic arrangement for implementing a lithographic process, the lithographic arrangement comprising:
   an illumination system configured to provide a beam of radiation;
   a support structure configured to support a patterning device, the patterning device serving to impart the beam of radiation with a pattern in its cross-section;
   a substrate table configured to hold a substrate;
   a projection system configured to project the patterned beam of radiation onto a target portion of the substrate;
   one or more controllers configured to control at least a part of the lithographic arrangement to form a pattern feature on the target portion of the substrate such that the patterned beam of radiation has one or both of a first property that varies in a first direction along a surface of the substrate, and a second property that varies in a second direction along a surface of the substrate;
   a measurement arrangement configured to measure a property of the pattern feature; and
   a computational arrangement configured to use the measured property of the pattern feature and at least one of the first property of the patterned beam of radiation and the second property of the patterned beam of radiation to obtain information for use in a model of the lithographic process.

17. A lithographic processing method, comprising:
   forming a pattern feature on a target portion of a substrate by projecting a beam of radiation onto the target portion of the substrate, for that target portion the beam of radiation having one or both of a first property that varies in a first direction along a surface of the substrate, and a second property that varies in a second direction along a surface of the substrate; and
   measuring a property of the pattern feature, wherein
   the measured property of the pattern feature and at least one of the first property of the beam of radiation and the second property of the beam of radiation are used in a model.

18. The lithographic processing method of claim 17, wherein the first property and second property are each a different one of: a focal property, a dose of radiation, an overlay, an illumination property.

19. The lithographic processing method of claim 17, further comprising forming pattern features on different target portions of the substrate by projecting a beam of radiation onto the different target portions of the substrate, the beam of radiation having a third property, the third property being different for different target portions.

20. The lithographic processing method of claim 17, further comprising forming pattern features on different target portions of the substrate by projecting a beam of radiation onto the different target portions of the substrate, the variation in the first and/or second property being different for different target portions.

* * * * *